United States Patent [19]

Casperson

[11] Patent Number: 5,321,582
[45] Date of Patent: Jun. 14, 1994

[54] ELECTRONIC COMPONENT HEAT SINK ATTACHMENT USING A LOW FORCE SPRING

[75] Inventor: Paul G. Casperson, Columbus, Ind.

[73] Assignee: Cummins Engine Company, Inc., Columbus, Ind.

[21] Appl. No.: 51,661

[22] Filed: Apr. 26, 1993

[51] Int. Cl.$^5$ .............................................. H05K 7/20
[52] U.S. Cl. .................................... 361/713; 257/709; 257/719; 361/705
[58] Field of Search ............... 165/80.3, 185; 257/706, 257/707, 709, 713, 718, 719; 24/458, 473; 174/52.1, 16.3; 361/704, 705, 707, 709, 713, 736, 752, 773, 807, 810

[56] References Cited

U.S. PATENT DOCUMENTS

| | | | |
|---|---|---|---|
| 4,605,986 | 8/1986 | Bentz | 361/386 |
| 4,707,726 | 11/1987 | Tinder . | |
| 4,845,590 | 7/1989 | Mikolajczak . | |
| 4,872,089 | 10/1989 | Ocken et al. . | |
| 4,891,735 | 1/1990 | Mikolajczak . | |
| 4,922,601 | 5/1990 | Mikolajczak . | |
| 4,964,198 | 10/1990 | McCarthy | 24/458 |
| 5,225,965 | 7/1993 | Bailey | 361/386 |

OTHER PUBLICATIONS

Chomerics, Cho-Therm 1680, Bulletin No. 68, "Thermally Conductive Insulator For Surface Mount Applications", 2 pages.

Primary Examiner—Gerald P. Tolin
Attorney, Agent, or Firm—Sixbey, Friedman, Leedom & Ferguson

[57] ABSTRACT

A thermal attachment assembly for heat generating electronic devices which includes a multi-element spring having low force, high deflection, spring fingers, and which is adjustable and attached by screws to a cover to apply pressure directly against electronic components arranged generally perpendicular to at least one edge of a printed wired board (PWB). The attachment assembly includes a heat sink housing in which the electronic components are pressed against an electrically insulating, thermally conductive film positioned against one wall of the heat sink housing. The PWB is snapped to a carrier and both are placed into the housing so that the electronic devices are positioned within spaces of the carrier. The carrier includes sloping surfaces, so that the spring fingers are deflected downward when the cover is attached to the housing, thereby insuring that the spring fingers are properly positioned onto the electronic devices, between the spaces of the carrier.

10 Claims, 4 Drawing Sheets

ELECTRONIC COMPONENT HEAT SINK ATTACHMENT USING A LOW FORCE SPRING

BACKGROUND OF THE INVENTION

1. Field of the Invention

This invention relates to the attachment of printed circuit board mounted, heat generating electrical components to heat sinks. In particular, to the attachment to such electrical components which have heat transfer tabs to heat sink housings using spring type members.

2. Description of Related Art

One method by which tabbed printed circuit board mounted, heat generating electrical components have been attached to heat sinks has involved individually attaching each device to the heat sink with a screw through the hole in the tab of the electronic device, and utilizing an electrically insulating thermally conductive film between the heat sink and the device tab. A nut is tightened onto the screw to provide the compressive force required to provide adequate compression of the film to maximize heat transfer from the device to the heat sink through the film. There are many variations of this technique, such as using a threaded hole in the heat sink rather than a nut. Problems arise with this general manner of attachment because the tension created by the screw may be relieved by material creep in the insulating washer or grommet, or the screw may back out under certain operating conditions, such as where the device is subject to vibration or temperature cycling. Another disadvantage is that the large number of parts that must be manually assembled when there are a number of heat generating components in an assembly, and it is difficult to automate the production of such attachments for high volume manufacturing.

In addition to the various uses of attachment screws, numerous attachment techniques have been developed which use spring members. A number of these attachments use clips with multiple spring fingers, as can be seen by reference to U.S. Pat. Nos. 4,922,601; 4,891,735; 4,872,089; 4,845,590; and 4,707,726, for example. Difficulties are encountered with these techniques for various reasons. To achieve a compact assembly, the springs must achieve high forces at low deflections, and this means that the springs must be manufactured specifically for an individual device and changing the device may cause the spring to exert too much or too little force since stiff springs have force constants which create a very narrow range of deflections within which the proper pressure will be applied. Furthermore, there is often a need for special tools to insure that the device or the spring is not damaged during assembly. Historically, electrically insulating and thermally conductive pads require 300-500 psi for effective heat transfer; but this requires a material to be disposed between the spring and the device to distribute the spring force on the device, to prevent the spring from damaging the device. Some arrangements require that the heat sink be a separate part from the housing, and others require numerous unique parts that need to be manually assembled.

Thus, there is a need for a heat sink attachment which will enable the use of low force springs in order to increase the range of permissible spring deflections, thereby increasing the tolerances and the variety of heat sinks which may be attached, and to eliminate the need for intervening materials for distributing the spring force. Additionally, a need also exists for an arrangement which will not require numerous parts that require manual assembly.

SUMMARY OF THE INVENTION

In keeping with the foregoing, primary objects of the present invention involve the provision of an attachment between numerous types of power generating electrical devices and a housing which also serves as a heat sink while:

minimizing the number of parts required;
facilitating manual or automated assembly;
achieving a minimal packaged volume; and
accepting of parts with a greater degree of dimensional tolerance.

These and other objects of the present invention are achieved by a thermal attachment assembly for heat generating electronic devices which includes a multi-element spring having low force, high deflection, spring fingers, and which is adjustable and attached by screws to a cover to apply pressure directly against electronic components arranged generally perpendicular to at least one edge of a printed wired board (PWB). Specifically, the attachment assembly includes a heat sink housing in which electronic components are pressed against an electrically insulating, thermally conductive film positioned against one wall of the heat sink housing. The PWB is snapped to a carrier and both are placed into the housing so that the electronic devices are positioned within the spaces of the carrier. The carrier includes sloping surfaces, so that the spring fingers are deflected away from the electronic device when the cover is attached to the housing, thereby insuring that the spring fingers are properly positioned onto the electronic devices, between the spaces of the carrier.

Ribs located on the sloped portion of the carrier, at points corresponding to the spaces between the spring fingers, facilitate manual assembly by aiding in the positioning of the spring/cover assembly on the carrier. The adjustable positioning capability of the spring fingers enables the assembly to tolerate dimensional variations in the individual parts of the assembly, such as the housing, film, electronic devices, cover, and the springs. The electronic devices may be located along only one side or both sides of the PWB.

These and further objects, features and advantages of the present invention will become apparent from the following description when taken in connection with the accompanying drawings which, for purposes of illustration only, show several embodiments in accordance with the present invention.

DETAILED DESCRIPTION OF THE PREFERRED EMBODIMENTS

Figure 1:
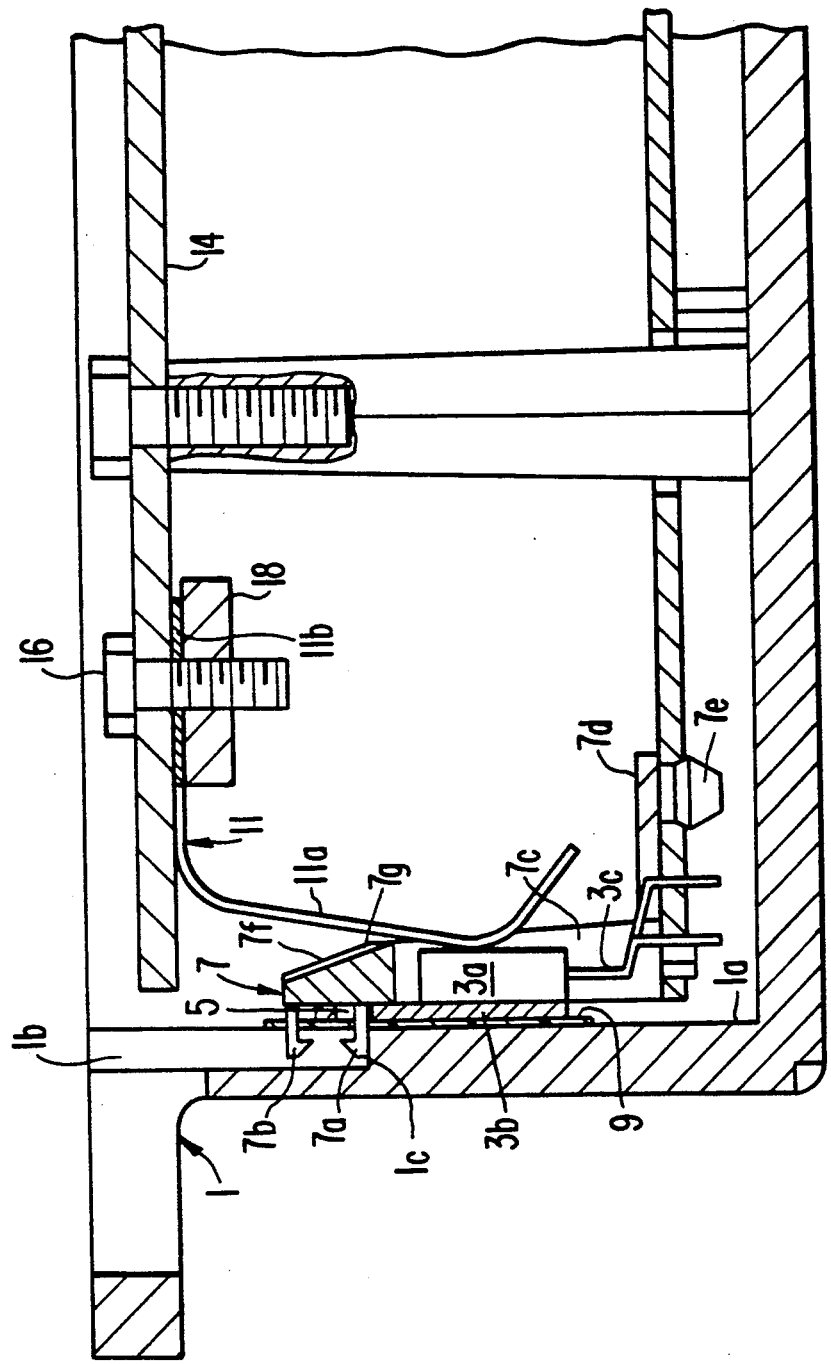
FIG. 1 shows a preferred embodiment of an attachment in accordance with the present invention in partial cross section.

FIG. 1 shows a preferred embodiment of an attachment in accordance with the present invention in which a housing 1 serves as a heat sink for at least one power generating electronic component 3, such as a TO220, that is provided with a body portion 3a from which a heat transfer tab 3b and leads 3c extend. A mounting hole 5 is provided in the heat transfer tab 3b to enable it to be snapped between hooks 7a, 7b and hung on the hook 7a of a carrier 7. The leads 3c of the electronic component 3 are S-shaped to minimize the force required to move the body portion 3a of the component 3 flush against an electrically insulative, thermally conductive film 9 and to minimize the stresses in the leads 3c after this displacement has been produced.

The electrically insulative, thermally conductive film 9 is formed of, for example, polyimide film beneath a layer of boron-nitride filled silicon as is sold by Chomerics, Inc. under the trademark CHO-THERM 1680, which will efficiently transfer heat away from mounted components without requiring a high clamping pressure. Furthermore, the film 9 is, preferably, adhesive-backed, as is the noted Chomerics product, so that it can be easily mounted to wall 1a of housing 1. The film 9 is provided with slot-shaped cutouts that are matched to slot-like recesses 1b that are formed in the housing wall 1a to receive the hooks 7a, 7b of the carrier 7.

Figure 3:
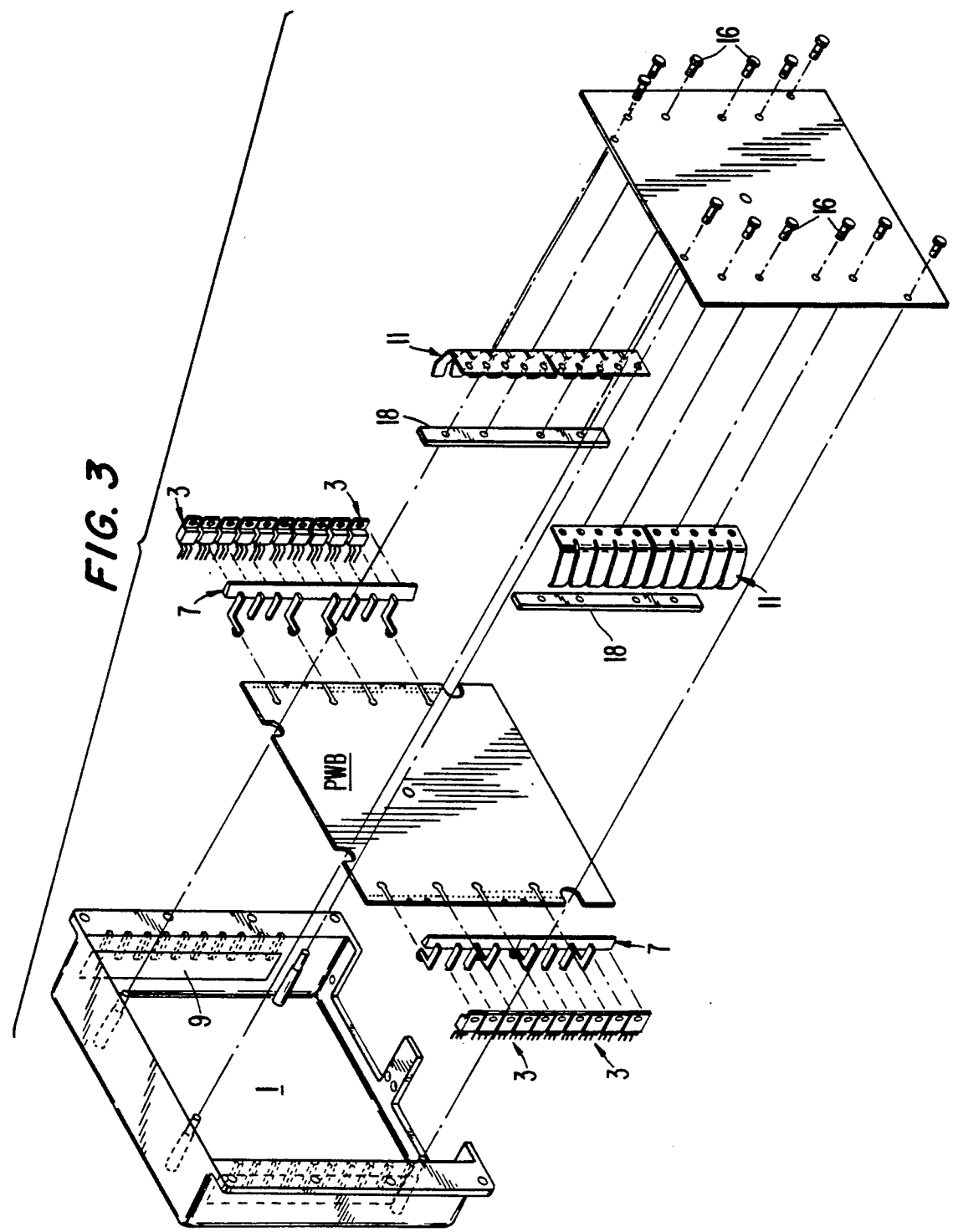
FIG. 3 is an exploded view of the assembly shown in FIG. 2.

To apply the body portion 3a of the electronic component against the film 9, a multi-element spring 11 is provided. The multi-element spring 11, as shown in FIG. 3, comprises a plurality of spring fingers 11a that are connected to a mounting strip 11b, which is attached to a housing cover 14 via screws 16 and a bar nut 18. The spacing of the fingers 11a is matched to the locations at which the tabs 3b of the electronic components 3 are snapped onto the hooks 7a and 7b. These spring fingers 11a need only exert a force which is the sum of the required pressure on the film 9 (e.g., 20-50 psi) divided by the surface area of the body portion 3a and tab portion 3b of component 3 that engages the film 9, plus the force required to move the electronic component 3 to the wall 1a of the housing 1.

The carrier 7 has vertical legs 7c which define spaces within which the body portion 3a of the components 3 can be received when hung on the hooks 7a. Some of the legs 7c have arms 7d from which a snap plug 7e projects. Snap plugs 7e are used to attach the carrier 7 to a printed wiring board (PWB, i.e., a printed circuit board without active components) at the correct location, by being snapped into openings formed in the PWB. The carrier 7, also, includes sloping surfaces 7f which serve to deflect the spring fingers 11a rightward, when the cover is attached to the housing, thereby insuring that the spring fingers 11a are properly positioned onto the electronic components 3, in the spaces between legs 7c of the carrier 7. Additionally, ribs 7g can be located on the sloping surfaces of the carrier, at points corresponding to the spaces between the spring fingers 11a, to facilitate assembly by aiding in the positioning of the spring/cover assembly (formed of housing cover 14 and spring 11 attached thereto) on the carrier 7, and providing tactile feedback if assembled manually. Furthermore, the downward force of the spring fingers 11a is transferred by the sloping surfaces 7f, through the hooks 7a, to the bottom 1c of the recesses 1b, on which the hooks 7a rest after the carrier has been lowered into the housing 1 and snapped into the PWB, so that stressing of the leads 3c of the components 3 during assembly is avoided.

Figure 2:
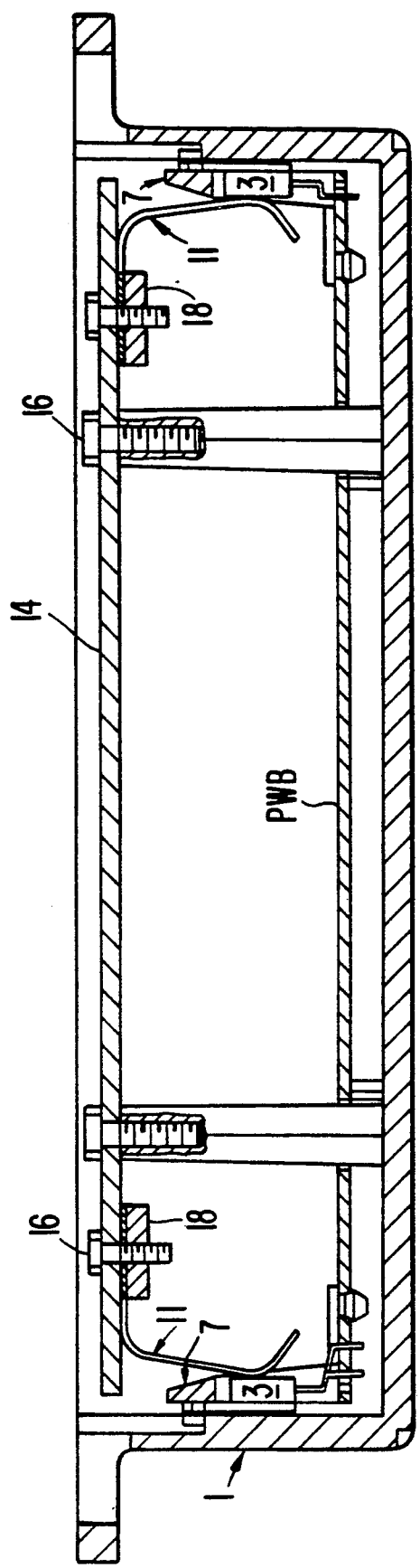
FIG. 2 is a cross-sectional view of an assembly in which a pair of attachment devices of the type shown in FIG. 1 are provided to balance each other.
Figure 4:
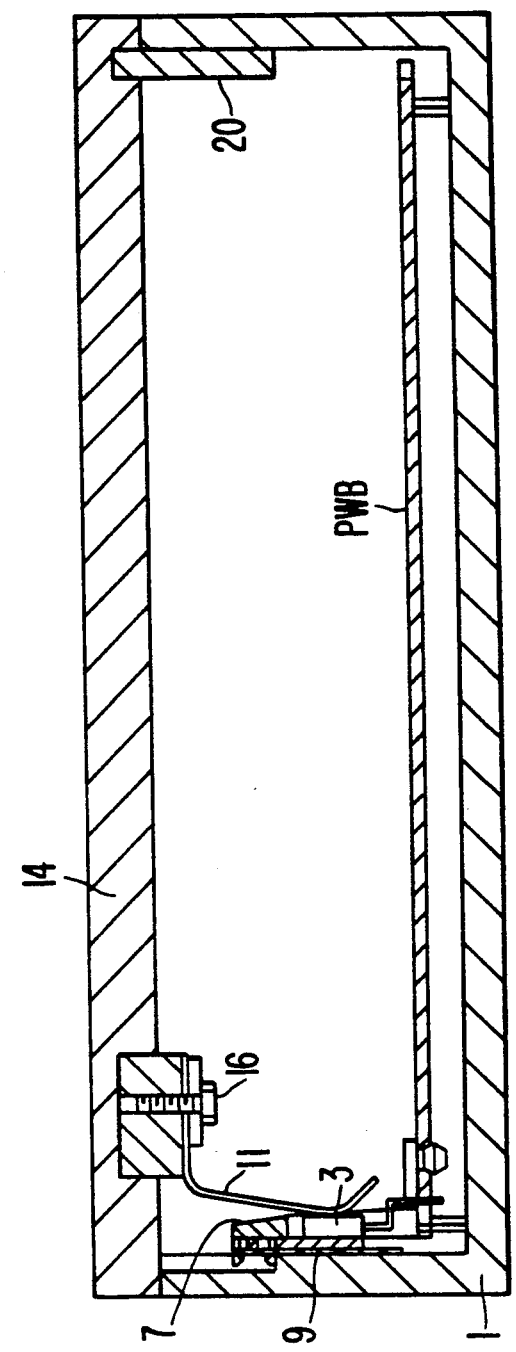
FIG. 4 is a cross-sectional view of an assembly in which the force of a single attachment device of the type shown in FIG. 1 is balanced by the provision of a surface on the cover which abuts a surface of the housing which is in opposition to the attachment device.

The force that the multi-element spring 11 generates must be counterbalanced by an equal and opposite force. In FIGS. 2 & 3, this counterbalancing is achieved by providing a multi-element springs 11 at each of opposite sides of the cover so that their spring fingers 11a balance each other. Alternatively, as shown in the embodiment of FIG. 4, where only a single row of spring fingers is utilized to act on components on one side of the housing 1, an abutment member 20 is utilized to provide the necessary counterbalancing effect. Abutment member 20 may be attached to the cover so that its side surface abuts the inner wall of the housing 1 when the cover is in place, or it may be attached to the inner wall of the housing 1 so as to engage in a complementarily-shaped recess in the cover when the cover is in place.

While I have shown and described various embodiments in accordance with the present invention, it is understood that the same is not limited thereto, but is susceptible of numerous changes and modifications as known to those skilled in the art, and we, therefore, do not wish to be limited to the details shown and described herein, but intend to cover all such changes and modifications as are encompassed by the scope of the appended claims.

INDUSTRIAL APPLICABILITY

The present invention will find a wide range of application to devices in which various electronic components, which generate amounts of heat which cannot be adequately dissipated without using a heat sink, are enclosed in a housing.

I claim:

1. Electronic component heat sink arrangement comprising a housing formed of a heat sinking material and containing a printed circuit wiring board and a plurality of heat generating electronic components, at least one carrier upon which said electronic components are supported and which is attached to said printed circuit wiring board, a cover panel closing an open end of the housing, and at least one spring member having a plurality of spring fingers pressing the electronic components into a nonelectrically conductive, heat exchange relationship with an inner wall surface of the housing; wherein a heat conductive, electrically insulating film is disposed between the electronic components and the inner wall surface of the housing; wherein said at least one spring member is mounted to an inner side of the cover panel; and wherein said at least one carrier has a deflection surface means for deflecting the spring fingers so as to prevent them from pressing down on the electronic components as the cover is being positioned onto the housing and which permits the spring fingers to freely engage a side of the electronic components once the cover is in position closing the open end of the housing.

2. Electronic component heat sink arrangement according to claim 1, wherein said spring fingers are constructed to apply a pressure in a range of 20-50 psi to a full range of differing sizes of electronic components supportable on said at least one carrier when engaged on the side thereof with the cover closing the housing.

3. Electronic component heat sink arrangement according to claim 1, wherein ribs are provided on said deflection surface means at positions corresponding to spaces between the spring fingers as a guide means for facilitating positioning of the at least one spring member and cover on said at least one carrier.

4. Electronic component heat sink arrangement according to claim 1, wherein said deflection surface means is formed on a side of a bar-shaped portion of the at least one carrier which faces away from the inner wall surface of the housing, and wherein hook means for supporting the electronic components are disposed on an opposite side of said bar-shaped portion of the at least one carrier and are engaged within slot-shaped recesses in the inner wall surface of the housing.

5. Electronic component heat sink arrangement according to claim 4, wherein said at least one carrier has vertical legs which extend down from said bar-shaped portion of the at least one carrier and define spaces within which a body portion of the components is received when hung on said hook means.

6. Electronic component heat sink arrangement according to claim 5, wherein some of said vertical legs have arms from which a snap plug projects, said snap plug being snapped into an opening formed in the wiring board.

7. Electronic component heat sink arrangement according to claim 6, wherein ribs are provided on said deflection surface means at positions corresponding to spaces between the spring fingers as a guide means for facilitating positioning of the at least one spring member and cover on said at least one carrier.

8. Electronic component heat sink arrangement according to claim 4, wherein a pair of said carriers are arranged in a row parallel to said inner wall surface of the housing.

9. Electronic component heat sink arrangement according to claim 4, wherein said at least one carrier is arranged parallel to said inner wall surface of the housing and at least one other carrier is arranged parallel to an opposite inner wall surface of the housing; and wherein a second spring member having a plurality of spring fingers is attached to the cover panel and presses electronic components into a nonelectrically conductive, heat exchange relationship with the opposite inner wall surface of the housing, the forces applied by the spring members counterbalancing each other.

10. Electronic component heat sink arrangement according to claim 4, wherein said at least one carrier is arranged parallel to said inner wall surface of the housing at only one side of the housing; and wherein abutment means is provided which acts between the cover panel and an opposite inner wall surface at an opposite side of the housing for counterbalancing the forces exerted by said spring member.

* * * * *